(12) United States Patent
Chang

(10) Patent No.: US 8,159,646 B2
(45) Date of Patent: Apr. 17, 2012

(54) ACTIVE DEVICE ARRAY SUBSTRATE WITH PARTICULAR TEST CIRCUIT

(75) Inventor: Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 520 days.

(21) Appl. No.: 12/488,596

(22) Filed: Jun. 22, 2009

(65) Prior Publication Data

US 2010/0244026 A1   Sep. 30, 2010

(30) Foreign Application Priority Data

Mar. 26, 2009   (TW) .................................. 98110002

(51) Int. Cl.
*G02F 1/1345* (2006.01)
*G02F 1/1333* (2006.01)
(52) U.S. Cl. ......... 349/149; 349/151; 349/152; 349/158
(58) Field of Classification Search .................. 349/149, 349/151, 152, 158
See application file for complete search history.

(56) References Cited

U.S. PATENT DOCUMENTS

| 6,798,232 | B2 * | 9/2004 | Lim | 324/760.01 |
| 6,940,301 | B2 * | 9/2005 | Chen | 324/760.01 |
| 7,122,888 | B2 * | 10/2006 | Egawa et al. | 257/691 |

FOREIGN PATENT DOCUMENTS

| JP | 2005-175492 | 6/2005 |
| TW | I252318 | 4/2006 |

* cited by examiner

*Primary Examiner* — Mike Qi
(74) *Attorney, Agent, or Firm* — Jianq Chyun IP Office

(57) ABSTRACT

An active device array substrate is provided. The active device array substrate includes an active matrix device, first bonding pads electrically connected to the active matrix device, second bonding pads electrically insulated from the first bonding pads, test bonding pads disposed between the first and the second bonding pads and separated from the second bonding pads, switch devices disposed between the test bonding pads and the first bonding pads and electrically connected to the test bonding pads, a test signal pad, a switch device control pad, and at least one driving chip electrically connected to the first bonding pads, the second bonding pads, and the test bonding pads. Each test bonding pad is corresponding to one of the second bonding pads. Both the test signal pad for inputting/outputting a test signal and the switch device control pad for turning on/off the switch devices are electrically connected to the switch devices.

9 Claims, 4 Drawing Sheets

ACTIVE DEVICE ARRAY SUBSTRATE WITH PARTICULAR TEST CIRCUIT

CROSS-REFERENCE TO RELATED APPLICATION

This application claims the priority benefit of Taiwan application serial no. 98110002, filed on Mar. 26, 2009. The entirety of the above-mentioned patent application is hereby incorporated by reference herein and made a part of specification.

BACKGROUND OF THE INVENTION

1. Field of the Invention

The present invention generally relates to an active device array substrate, and more particularly, to an active device array substrate with a test circuit.

2. Description of Related Art

Various displays have been quickly developed along with the advancement of photoelectronic and semiconductor technologies. Liquid crystal display (LCD) has been broadly applied and is about to replace the conventional cathode ray tube (CRT) as the mainstream among the next-generation displays.

In order to improve the yield of active device array substrate in LCD, an electrical test is usually carried out to devices or circuits on an active device array substrate right after the active device array substrate is fabricated to determine whether these devices or circuits work properly. In order to test the bonding state between a driving chip and bonding pads on an active device array substrate, a microscope is usually used to observe the bonding state between the driving chip and the bonding pads. However, such a technique is very time-consuming and may produce human errors. Thereby, a design of disposing a circuit with an electrical test function in a peripheral circuit area of an active device array substrate is provided.

FIG. 1 is a partial top view of a conventional active device array substrate. Referring to FIG. 1, the active device array substrate 100 includes an active matrix device 110 disposed in the display area I' and a plurality of first bonding pads 120a, 120b, 120c, . . . , a plurality of second bonding pads 130a, 130b, 130c, . . . , a test signal pad 160, and a driving chip (not shown) disposed in the peripheral circuit area II'. The first bonding pads 120a, 120b, 120c, . . . are electrically connected to the active matrix device 110, and the first bonding pads 120a, 120b, 120c, . . . and the second bonding pads 130a, 130b, 130c, . . . are electrically connected to the driving chip.

As described above, the first bonding pad 120a at the left side of FIG. 1 is electrically connected to the test signal pad 160. Thus, when the first bonding pads 120a, 120b, 120c, . . . and the second bonding pads 130a, 130b, 130c, . . . are bonded with the driving chip, the electrical property between the first bonding pad 120a and the driving chip can be understood through a test signal on the test signal pad 160, so that the bonding state between the first bonding pad 120a and the driving chip can be determined. However, the test signal pad 160 can only test the bonding state between the first bonding pad 120a and the driving chip while the bonding states between the first bonding pads 120b, 120c, . . . and the driving chip cannot be determined.

SUMMARY OF THE INVENTION

Accordingly, the present invention is directed to an active device array substrate with a inspection circuit, wherein the inspection circuit can test the bonding states between a plurality of bonding pads and a driving chip electrically connected to the bonding pads.

The present invention provides an active device array substrate having a display area and an adjacent peripheral circuit area. The active device array substrate includes an active matrix device, a plurality of first bonding pads, a plurality of second bonding pads, a plurality of test bonding pads, a plurality of switch devices, a test signal pad, a switch device control pad, and at least one driving chip. The active matrix device is disposed in the display area, and the first bonding pads and the second bonding pads are disposed in the peripheral circuit area, wherein the first bonding pads are electrically connected to the active matrix device, and the second bonding pads are electrically insulated from the first bonding pads. The test bonding pads are disposed in the peripheral circuit area between the second bonding pads and the first bonding pads, and are separated from the second bonding pads. Each of the test bonding pads is corresponding to one of the second bonding pads. The switch devices are disposed in the peripheral circuit area between the test bonding pads and the first bonding pads, and are electrically connected to test bonding pads. The test signal pad and the switch device control pad are disposed in the peripheral circuit area, and are electrically connected to the switch devices. The test signal pad inputs or outputs a test signal, and the switch device control pad turns on or off the switch devices. The driving chip is electrically connected to the first bonding pads, the second bonding pads, and the test bonding pads.

According to an embodiment of the present invention, the driving chip includes a plurality of first pins and a plurality of second pins. The first pins are electrically connected to the first bonding pads, and the second pins are electrically connected to the second bonding pads and the test bonding pads. According to an embodiment, each of the second pins includes a driving portion and a test portion, wherein the driving portion is electrically connected to the corresponding second bonding pad, and the test portion is electrically connected to the corresponding test bonding pad. According to an embodiment, in each of the second pins, the driving portion and the test portion are electrically connected to each other. According to another embodiment, in each of the second pins, the driving portion and the test portion are separated from each other.

According to an embodiment of the present invention, the active device array substrate further includes an anisotropic conductive medium, wherein the anisotropic conductive medium is disposed between the first bonding pads, the second bonding pads, and the test bonding pads and the driving chip.

According to an embodiment of the present invention, the active device array substrate further includes a flexible printed circuit board, a plurality of flexible printed circuit bonding pads, and a plurality of lead wires. The flexible printed circuit bonding pads are disposed in the peripheral circuit area, and are electrically connected to the flexible printed circuit board. The lead wires are electrically connected between the corresponding flexible printed circuit bonding pads and the corresponding second bonding pads respectively.

According to an embodiment of the present invention, each of the switch devices is a thin film transistor (TFT). According to an embodiment, each of the TFTs has one end electrically connected to test bonding pads, another end electrically connected to test signal pad, and yet another end electrically connected to switch device control pad.

As described above, the present invention provides an active device array substrate with a inspection circuit, wherein the inspection circuit has a plurality of test bonding pads. The bonding states between bonding pads and a driving chip can be tested through the corresponding test bonding pads, so that the electrical relationships and bonding states between the bonding pads and the driving chip can be determined.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
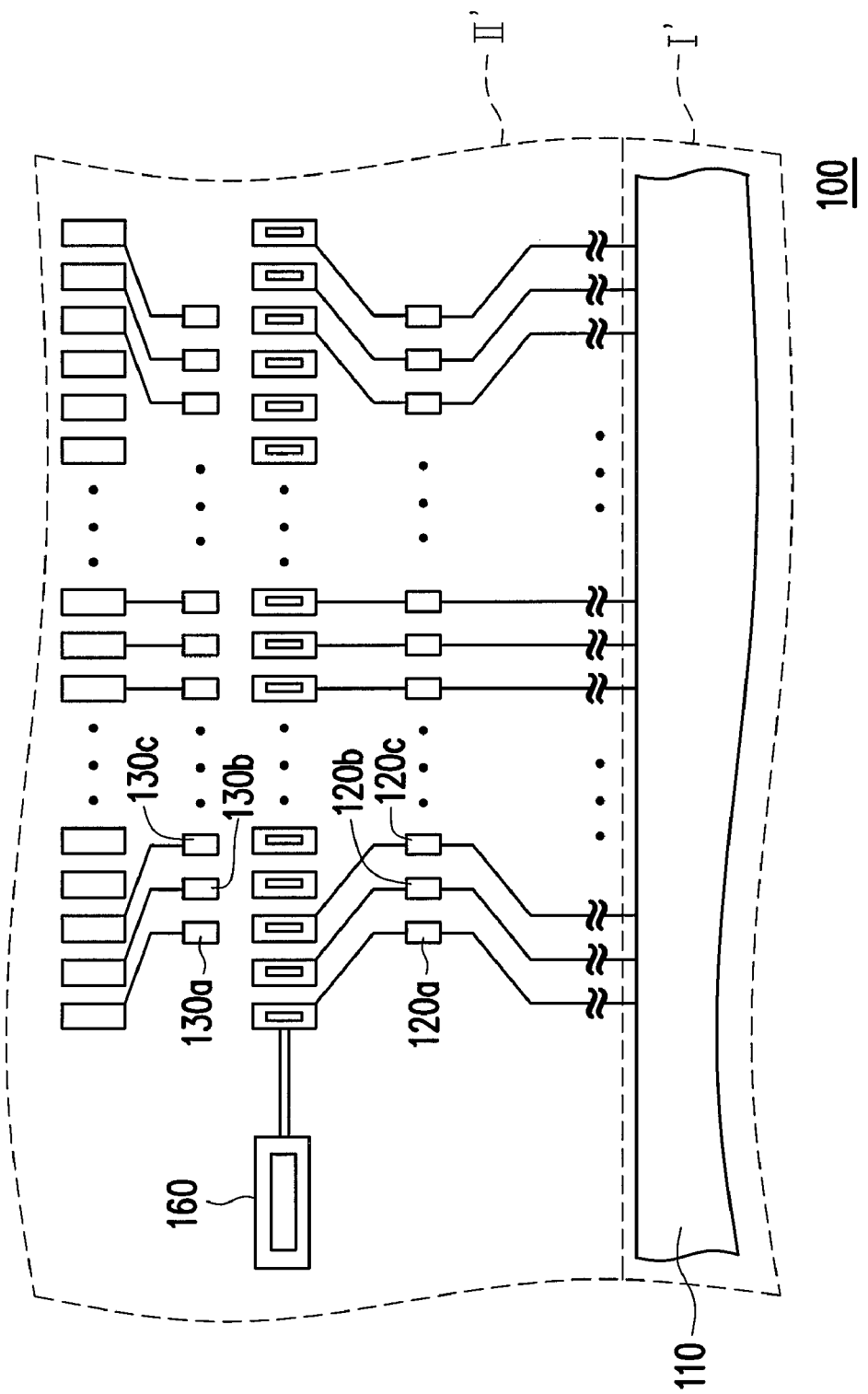
FIG. 1 is a partial top view of a conventional active device array substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2:
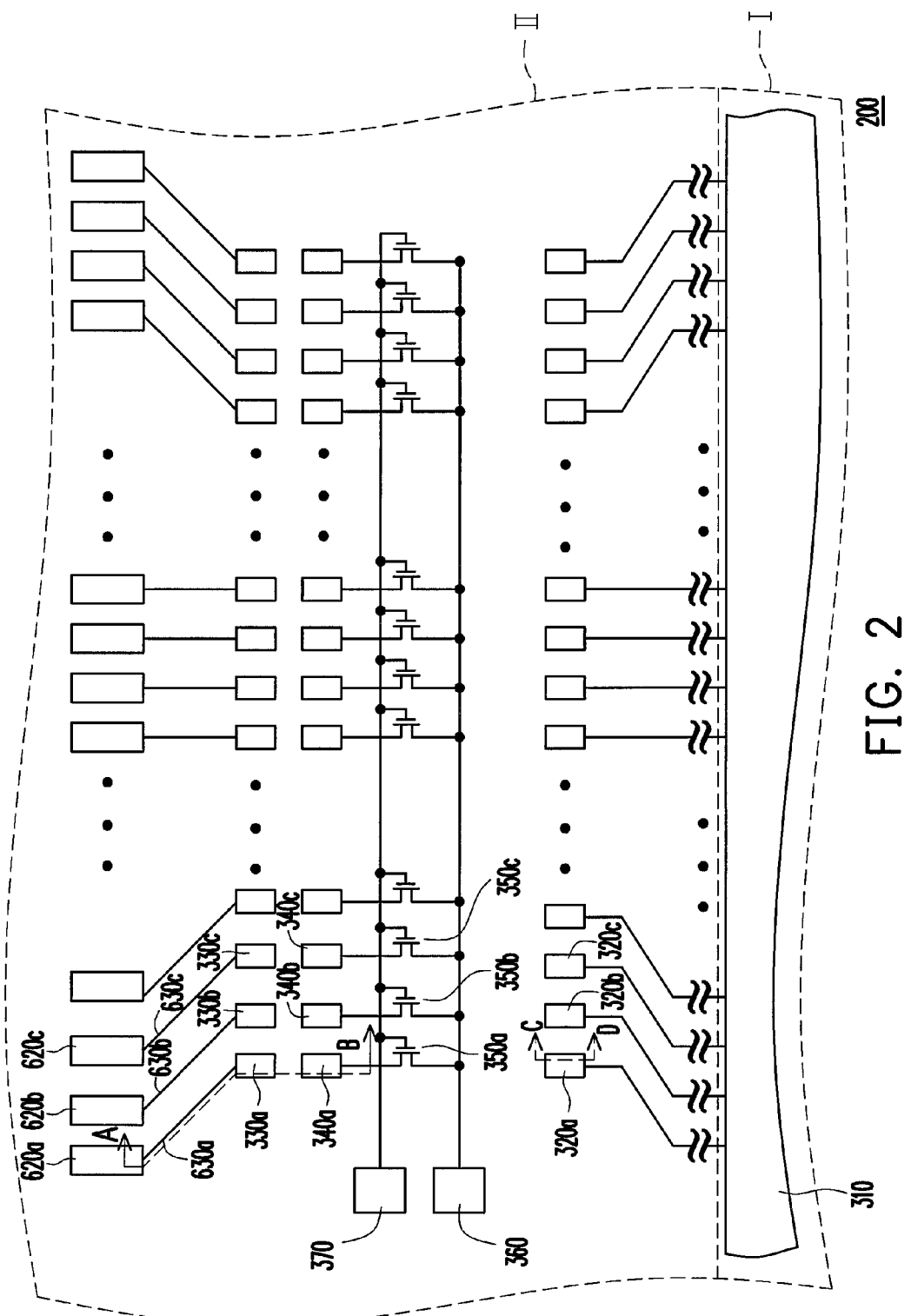
FIG. 2 is a partial top view of an active device array substrate according to an embodiment of the present invention.
Figure 3:
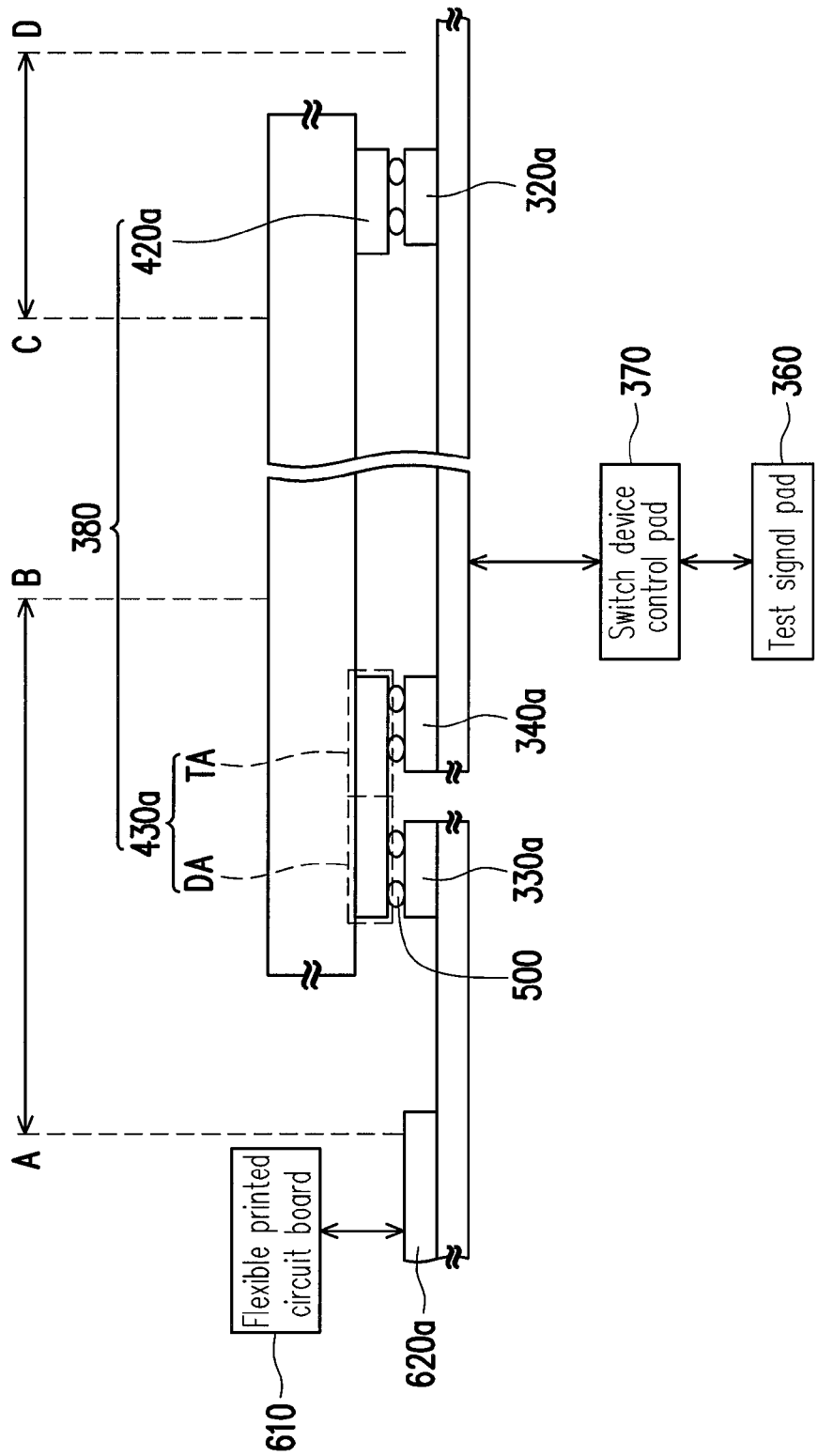
FIG. 3 is a cross-sectional view of the active device array substrate in FIG. 2 along line A-B and line C-D.

FIG. 2 is a partial top view of an active device array substrate according to an embodiment of the present invention, and FIG. 3 is a cross-sectional view of the active device array substrate in FIG. 2 along line A-B and line C-D, wherein the structure corresponding to the area AB in FIG. 3 is the cross section of the active device array substrate along the line A-B in FIG. 2, and the structure corresponding to area CD in FIG. 3 is the cross section of the active device array substrate along the line C-D in FIG. 2.

Referring to both FIG. 2 and FIG. 3, in the present embodiment, the active device array substrate 200 has a display area I and an adjacent peripheral circuit area II, and the active device array substrate 200 includes an active matrix device 310 disposed in the display area I and a plurality of first bonding pads 320a, 320b, 320c, . . . , a plurality of second bonding pads 330a, 330b, 330c, . . . , a plurality of test bonding pads 340a, 340b, 340c, . . . , a plurality of switch devices 350a, 350b, 350c, . . . , a test signal pad 360, and a switch device control pad 370, and at least one driving chip 380 disposed in the peripheral circuit area II.

For the convenience of description, following embodiments will be described by taking only one driving chip 380 as an example. However, the number of the driving chip is not limited in the present invention, and in real applications, the number of the driving chip 380 can be determined according to the actual requirement.

In the present embodiment, the active device array substrate 200 may be a glass substrate having a chip or chips thereon, wherein the active matrix device 310 may be composed of a plurality of pixel units (not shown) with active devices (not shown), and the driving chip 380 may be a gate driving chip or a source driving chip for driving the pixel units in the active matrix device 310.

Besides, in the present embodiment, the driving chip 380 may be bonded to the first bonding pads 320a, 320b, 320c, . . . , the second bonding pads 330a, 330b, 330c, . . . , and the test bonding pads 340a, 340b, 340c, . . . through a chip on glass (COG) process. The following, the active matrix device 310, the first bonding pads 320a, 320b, 320c, . . . , the second bonding pads 330a, 330b, 330c, . . . , and the driving chip 380 in the present embodiment are first described.

In the present embodiment, the driving chip 380 is electrically connected to the first bonding pads 320a, 320b, 320c, . . . and the second bonding pads 330a, 330b, 330c, . . . , wherein the first bonding pads 320a, 320b, 320c, . . . are electrically connected to the active matrix device 310 but are electrically insulated from the second bonding pads 330a, 330b, 330c, . . . . Practically, the driving chip 380 is electrically connected to the first bonding pads 320a, 320b, 320c, . . . and the second bonding pads 330a, 330b, 330c, . . . through a plurality of pins (described below) thereof, and provides a driving signal to the active matrix device 310 through the first bonding pads 320a, 320b, 320c, . . . and the second bonding pads 330a, 330b, 330c, . . . .

For example, the driving chip 380 includes a plurality of first pins and a plurality of second pins, and only one first pin 420a and one second pin 430a are illustrated in FIG. 3 as examples. In the present embodiment, the first pins (for example, the first pin 420a) are electrically connected to the first bonding pads (for example, the first bonding pad 320a), and the second pins (for example, the second pin 430a) are electrically connected to the second bonding pads (for example, the second bonding pad 330a) so that the active matrix device 310 can receive a driving signal through the driving chip 380.

In the present embodiment, the electrical connection between the first pins (for example, the first pin 420a) and the first bonding pads (for example, the first bonding pad 320a) and the electrical connection between the second pins (for example, the second pin 430a) and the second bonding pads (for example, the second bonding pad 330a) are implemented with an anisotropic conductive medium 500. The anisotropic conductive medium 500 is an anisotropic conductive material, such as an anisotropic conductive film (ACF) or an anisotropic conductive paste (ACP).

To be more specific, the anisotropic conductive medium 500 is disposed between the first bonding pads (for example, the first bonding pad 320a) and the first pins (for example, the first pin 420a) and between the second bonding pads (for example, the second bonding pad 330a) and the second pins (for example, the second pin 430a). Generally, the anisotropic conductive medium 500 is composed of conductive particles. By pressing the first bonding pads (for example, the first bonding pad 320a) and the first pins (for example, the first pin 420a) together and the second bonding pads (for example, the second bonding pad 330a) and the second pins (for example, the second pin 430a) together, a short circuit is formed between the bonding pads (for example, the first bonding pad 320a and the second bonding pad 330a), the conductive particles, and the pins (for example, the first pin 420a and the second pin 430a) so that the bonding pads (for example, the first bonding pad 320a and the second bonding pad 330a) and the pins (for example, the first pin 420a and the second pin 430a) are electrically connected to each other.

The disposition relationship among the anisotropic conductive medium 500, the other pads and the corresponding pins can be obtained based on foregoing descriptions therefore will not be described herein. In short, the anisotropic conductive medium 500 is disposed between the first bonding pads 320a, 320b, 320c, and the driving chip 380 and between the second bonding pads 330a, 330b, 330c, and the driving chip 380 so that the first bonding pads 320a, 320b, 320c, . . . and the second bonding pads 330a, 330b, 330c, . . . can be electrically connected to the driving chip 380 through the anisotropic conductive medium 500.

On the other hand, referring to both FIG. 2 and FIG. 3, in the present embodiment, the active device array substrate 200 may further include a flexible printed circuit (FPC) board 610, a plurality of flexible printed circuit bonding pads 620a, 620b, 620c, . . . , and a plurality of lead wires 630a, 630b, 630c, . . . , wherein the flexible printed circuit board 610 is electrically connected to the flexible printed circuit bonding pads 620a, 620b, 620c, . . . disposed in the peripheral circuit area II, and the lead wires 630a, 630b, 630c, . . . are electrically connected between the corresponding flexible printed circuit bonding pads 620a, 620b, 620c, . . . and the corresponding second bonding pads 330a, 330b, 330c, . . . respectively.

To be specific, the lead wire 630a is electrically connected between the flexible printed circuit bonding pad 620a and the second bonding pad 330a, the lead wire 630b is electrically connected between the flexible printed circuit bonding pad 620b and the second bonding pad 330b, the lead wire 630c is electrically connected between the flexible printed circuit bonding pad 620c and the second bonding pad 330c, and so on.

Accordingly, in the present embodiment, a signal output by the flexible printed circuit board 610 can be transmitted to the second bonding pad 330a through the flexible printed circuit bonding pad 620a and the lead wire 630a and to the second pin 430a of the driving chip 380 through the anisotropic conductive medium 500. After receiving this signal, the driving chip 380 generates a driving signal for the active matrix device 310. Then, the driving signal is transmitted to the active matrix device 310 through the first pin 420a, the anisotropic conductive medium 500, and the first bonding pad 320a.

How the active matrix device 310 and the driving chip 380 in the display area I are connected to each other through the first bonding pads 320a, 320b, 320c, . . . and the second bonding pads 330a, 330b, 330c, . . . in the peripheral circuit area II and how the active matrix device 310 obtains the driving signal provided by the driving chip 380 can be understood based on foregoing descriptions. However, if there is a bad electrical relationship between the driving chip 380 and the second bonding pads 330a, 330b, 330c, . . . , the driving signal required by the active matrix device 310, and accordingly the display quality of the display device, may be affected.

In order to fully understand the electrical relationship between the driving chip 380 and the second bonding pads 330a, 330b, 330c, . . . , in the present embodiment, the test bonding pads 340a, 340b, 340c, . . . , the switch devices 350a, 350b, 350c, . . . , the test signal pad 360, and the switch device control pad 370 are disposed in the peripheral circuit area II. The relationship between the test bonding pads 340a, 340b, 340c, . . . , the switch devices 350a, 350b, 350c, . . . , the test signal pad 360, and the switch device control pad 370 will be described in following embodiment.

In the present embodiment, the test bonding pads 340a, 340b, 340c, . . . respectively corresponding to the second bonding pads 330a, 330b, 330c, . . . are disposed in the peripheral circuit area II between the second bonding pads 330a, 330b, 330c, . . . and the first bonding pads 320a, 320b, 320c, . . . , and are separated from the first bonding pads 320a, 320b, 320c, . . . and the second bonding pads 330a, 330b, 330c, . . . . In addition, the switch devices 350a, 350b, 350c, . . . are disposed between the test bonding pads 340a, 340b, 340c, . . . and the first bonding pads 320a, 320b, 320c, . . . .

In the present embodiment, the switch devices 350a, 350b, 350c, . . . are thin film transistors (TFTs), for example, wherein the three ends of each TFT are electrically connected to the test bonding pads 340a, 340b, 340c, . . . , the test signal pad 360, and the switch device control pad 370 respectively. To be specific, one end of the source/drain of a TFT is electrically connected to the test bonding pads 340a, 340b, 340c, . . . , and the other one end of the source/drain of the TFT is electrically connected to the test signal pad 360, and the gate of the TFT is electrically connected to the switch device control pad 370.

Accordingly, in the present embodiment, a test signal can be transmitted into the test bonding pads 340a, 340b, 340c, . . . through the test signal pad 360. To be more specific, the switch device control pad 370 and the test signal pad 360 respectively provide a turn-on signal and a test signal to the switch devices 350a, 350b, 350c, . . . so that the test bonding pads 340a, 340b, 340c, . . . electrically connected to the switch devices 350a, 350b, 350c, . . . can receive the test signal. Namely, in the present embodiment, the switch devices 350a, 350b, 350c, . . . are served as bridges between the test signal pad 360 and the test bonding pads 340a, 340b, 340c, . . . for transmitting a test signal, wherein the on/off state of the switch devices 350a, 350b, 350c, . . . is controlled by a control signal on the switch device control pad 370.

For example, referring to both FIG. 2 and FIG. 3, the switch devices 350a, 350b, 350c, . . . receive a turn-on signal (for example, a high-level signal) through the switch device control pad 370 and accordingly are turned on. Then, the test bonding pads 340a, 340b, 340c, . . . receive the test signal from the test signal pad 360 through the switch devices 350a, 350b, 350c, . . . .

As shown in FIG. 2, in the present embodiment, an anisotropic conductive medium 500 is further disposed between the test bonding pads 340a, 340b, 340c, . . . and the driving chip 380. Accordingly, each of the test bonding pads (for example, the test bonding pad 340a) is electrically connected to the corresponding second pin (for example, the second pin 430a). Each of the second pins (for example, the second pin 430a) is divided into a driving portion DA and a test portion TA, wherein the driving portion DA is electrically connected to the corresponding second bonding pad (for example, the second bonding pad 330a), and the test portion TA is electrically connected to the corresponding test bonding pad (for example, the test bonding pad 340a).

As described above, after the test bonding pad 340a receives the test signal, it transmits the test signal to the second bonding pad 330a through the anisotropic conductive medium 500 and the driving chip 380 and then to the flexible printed circuit bonding pad 620a through the lead wire 630a. The signal transmission between the test bonding pads 340b, 340c, . . . , the switch devices 350b, 350c, . . . , the second bonding pads 330b, 330c, . . . , and the flexible printed circuit bonding pads 620b, 620c, . . . can be understood based on foregoing description therefore will not be described herein. In short, in the present embodiment, the test signal can be obtained through the second bonding pads 330a, 330b, 330c, . . . and the flexible printed circuit bonding pads 620a, 620b, 620c, . . . connected correspondingly to the test bonding pads 340a, 340b, 340c, . . . , and accordingly the electrical relationship between the second bonding pads 330a, 330b, 330c, . . . and the driving chip 380 can be determined.

Figure 4:
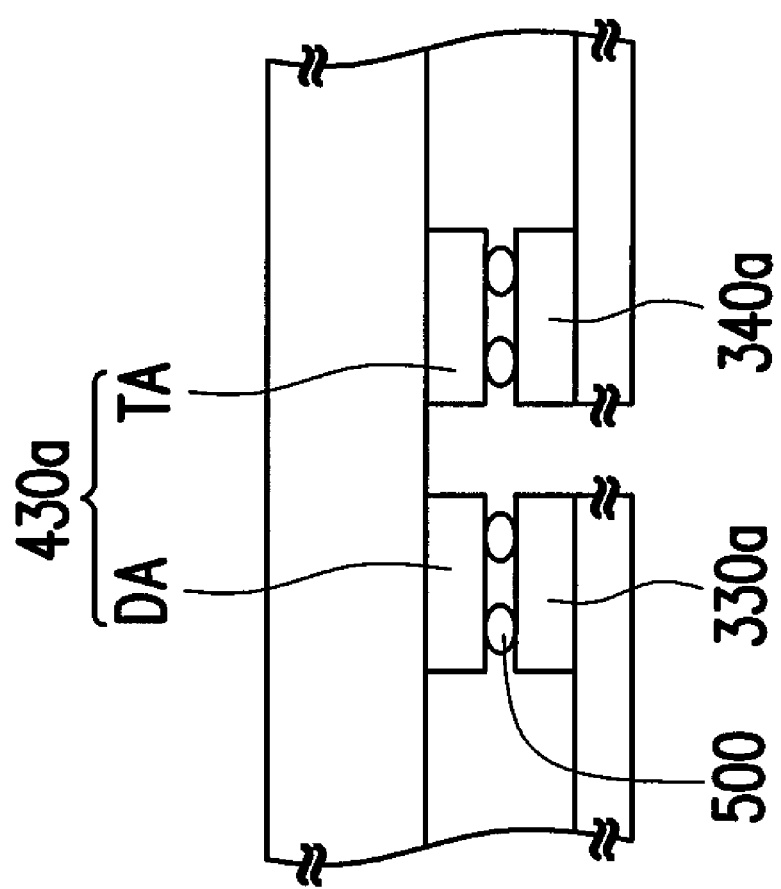
FIG. 4 is a partial top view of another active device array substrate according to another embodiment of the present invention.

It should be noted that the second pin 430a illustrated in FIG. 3 may be composed of a driving portion DA and a test portion TA which are formed integrally. Namely, in the present embodiment, the driving portion DA and the test portion TA are electrically connected to each other. However, in another embodiment, the driving portion DA electrically connected to the second bonding pad (for example, the second bonding pad 330a) and the test portion TA electrically connected to the test bonding pad (for example, the test bonding pad 340a) may also be separated from each other, such as the second pins (for example, the second pin 430a) illustrated in FIG. 4.

In addition, in another embodiment, when the switch devices 350a, 350b, 350c, . . . are turned on, the test signal may also be input into the flexible printed circuit bonding pads 620a, 620b, 620c, . . . , so that the test signal can be transmitted to the test signal pad 360 after sequentially passing through the lead wires 630a, 630b, 630c, . . . , the second bonding pads 330a, 330b, 330c, . . . , the driving chip 380, the test bonding pads 340a, 340b, 340c, . . . , and the switch devices 350a, 350b, 350c, . . . . Accordingly, the electrical relationship and bonding state between the second bonding pads 330a, 330b, 330c, . . . and the driving chip 380 can also be obtained by detecting the test signal output by the test signal pad 360.

As described above, the electrical relationship, and accordingly the bonding state, between the second bonding pads 330a, 330b, 330c, . . . and the driving chip 380 can be understood by turning on the switch devices 350a, 350b, 350c, . . . and supplying the test signal. From the viewpoint of the product, the yield of the active device array substrate 200 and accordingly the display quality of a display device which adopts the active device array substrate 200 can be improved. From the viewpoint of the process, when there is a bad connection between the second bonding pads 330a, 330b, 330c, . . . , and the driving chip 380, the bad bonding area can be detected instantly so that the bad active device array substrate 200 won't affect subsequent processes and unnecessary working time and cost can be avoided.

Contrarily, if the conventional inspection circuit is adopted, an additional microscope has to be used for observing the bonding state between the bonding pads and the driving chip, and very limited information is obtained from such testing process. While in the present embodiment, the bonding pads electrically connected to the driving chip can be also correspondingly connected to a plurality of test bonding pads, and the bonding state between each bonding pad and the driving chip can be determined through a test signal. Accordingly, the labor cost for using the microscope can be omitted and human error can be avoided. As a result, the reliability of the test is improved.

It should be mentioned that when the switch devices 350a, 350b, 350c, . . . are turned off, the test bonding pads 340a, 340b, 340c, . . . and the test signal pad 360 are electrically insulated from the driving chip 380 and the second bonding pads 330a, 330b, 330c, . . . . In other words, after performing the test by using the test bonding pads 340a, 340b, 340c, . . . , the switch devices 350a, 350b, 350c, . . . , the test signal pad 360, and the switch device control pad 370, no additional step is taken in the present embodiment to break or destroy the circuit layout of the test bonding pads 340a, 340b, 340c, . . . , the switch devices 350a, 350b, 350c, . . . , the test signal pad 360, or the switch device control pad 370, so that no unnecessary step is taken in the process and both the duration and cost of the process can be reduced.

As described above, in an active device array substrate provided by the present invention, the electrical connection and bonding state between a driving chip and a plurality of bonding pads disposed on the active device array substrate can be tested. By disposing a plurality of test bonding pads on the active device array substrate, the electrical relationship, and accordingly the bonding state, between the driving chip and the bonding pads can be determined. Thereby, the yield and reliability of the active device array substrate are improved, the fabrication process thereof is simplified, and both the duration and cost of the process are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, having a display area and an adjacent peripheral circuit area, the active device array substrate comprising:
   an active matrix device, disposed in the display area;
   a plurality of first bonding pads, disposed in the peripheral circuit area and electrically connected to the active matrix device;
   a plurality of second bonding pads, disposed in the peripheral circuit area and electrically insulated from the first bonding pads;
   a plurality of test bonding pads, disposed in the peripheral circuit area between the second bonding pads and the first bonding pads, and separated from the second bonding pads, wherein each of the test bonding pads is corresponding to one of the second bonding pads;
   a plurality of switch devices, disposed in the peripheral circuit area between the test bonding pads and the first bonding pads, and electrically connected to the test bonding pads;
   a test signal pad, disposed in the peripheral circuit area, and electrically connected to the switch devices, for inputting or outputting a test signal;
   a switch device control pad, disposed in the peripheral circuit area, and electrically connected to the switch devices, for turning on or off the switch devices; and
   at least one driving chip, electrically connected to the first bonding pads, the second bonding pads, and the test bonding pads.

2. The active device array substrate according to claim 1, wherein the driving chip comprises:
   a plurality of first pins, electrically connected to the first bonding pads; and
   a plurality of second pins, electrically connected to the second bonding pads and the test bonding pads.

3. The active device array substrate according to claim 2, wherein each of the second pins comprises:
   a driving portion, electrically connected to the corresponding second bonding pad; and
   a test portion, electrically connected to the corresponding test bonding pad.

4. The active device array substrate according to claim 3, wherein in each of the second pins, the driving portion and the test portion are electrically connected to each other.

5. The active device array substrate according to claim 3, wherein in each of the second pins, the driving portion and the test portion are separated from each other.

6. The active device array substrate according to claim 1, further comprising:
   an anisotropic conductive medium, disposed between the first bonding pads, the second bonding pads, and the test bonding pads and the driving chip.

7. The active device array substrate according to claim 1, further comprising:
- a flexible printed circuit board;
- a plurality of flexible printed circuit bonding pads, disposed in the peripheral circuit area, and electrically connected to the flexible printed circuit board; and
- a plurality of lead wires, electrically connected between the corresponding flexible printed circuit bonding pads and the corresponding second bonding pads respectively.

8. The active device array substrate according to claim 1, wherein each of the switch devices is a thin film transistor (TFT).

9. The active device array substrate according to claim 8, wherein each of the TFTs has one end electrically connected to the test bonding pads, another end electrically connected to the test signal pad, and yet another end electrically connected to the switch device control pad.

* * * * *